United States Patent
Rahim (10) Patent No.: US 6,362,525 B1
(45) Date of Patent: Mar. 26, 2002

(54) CIRCUIT STRUCTURE INCLUDING A PASSIVE ELEMENT FORMED WITHIN A GRID ARRAY SUBSTRATE AND METHOD FOR MAKING THE SAME

(75) Inventor: Irfan M. Rahim, Milpitas, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/436,914

(22) Filed: Nov. 9, 1999

(51) Int. Cl.⁷ .......................... H05K 7/02; H01L 21/70; H01L 23/34; H01L 23/48; H01L 27/02
(52) U.S. Cl. ....................... 257/738; 257/738; 257/728; 257/737; 257/723; 257/778; 257/528; 257/531; 257/777; 257/668; 257/700; 257/701; 361/760; 361/764; 361/765; 361/767; 438/381; 438/238
(58) Field of Search ................................ 257/737, 738, 257/728, 723, 724, 700, 701, 777–782, 686, 685, 787, 788, 690, 691, 774, 528, 531; 361/767, 760, 764, 765; 438/381, 238

(56) References Cited

U.S. PATENT DOCUMENTS 5,369,249 A  * 11/1994 Kwon ........................... 336/232
5,446,311 A  *  8/1995 Ewen et al. ................. 257/531

(List continued on next page.)

FOREIGN PATENT DOCUMENTS

| JP | 4-284686 | * 10/1992 |
| JP | 8-288143 | * 11/1996 |
| JP | 9-232144 | *  9/1997 |
| JP | 01-7602  | *  1/2001 |

OTHER PUBLICATIONS

Davis et al., "Silicon–on–Silicon Integration of a GSM Transceiver with VCO Resonator," 1998 IEEE International Solid–State Circuits Conference, 2 pages.

Horng et al., "Accurate measurement of ground–ring inductance in ball grid array package," Electronics Letters, Apr. 1999, vol. 35, No. 7, pp. 520–521.

Nargi–Toth et al., "Manufacturing High–Density Interconnect Structures," Circuits Assembly, Feb. 1999, pp. 40–42, 44, 46–47.

*Primary Examiner*—Alexander O. Williams
(74) *Attorney, Agent, or Firm*—Kevin L. Daffer; Conley, Rose & Tayon P.C.

(57) ABSTRACT

A circuit structure combines an integrated circuit with a passive circuit element formed within a grid-array substrate. Formation of the circuit structure includes forming a passive circuit element within one or more conductive layers of a grid-array substrate such as may be used for packaging of integrated circuits. A pair of terminals of the passive circuit element is coupled to a pair of passive element contact pads within a processed surface of the integrated circuit, thereby connecting the integrated circuit to the grid-array substrate. The same grid-array substrate may be used for formation of the passive circuit element and for packaging of the integrated circuit. In some embodiments the lateral extent of the integrated circuit overlaps the lateral extent of the passive circuit element. Alternatively, the passive circuit element may be laterally displaced from the integrated circuit. A low-loss substrate may be mounted onto the grid-array substrate, and laterally displaced from the integrated circuit such that the lateral extent of the low-loss substrate overlaps that of the passive circuit element.

20 Claims, 5 Drawing Sheets

U.S. PATENT DOCUMENTS

| | | | | |
|---|---|---|---|---|
| 5,497,033 A | * | 3/1996 | Fillion et al. | 257/723 |
| 5,541,135 A | | 7/1996 | Pfeifer et al. | |
| 5,611,008 A | | 3/1997 | Yap | |
| 5,670,824 A | | 9/1997 | Weinberg | |
| 5,717,245 A | * | 2/1998 | Pedder | 257/691 |
| 5,752,182 A | | 5/1998 | Nakatsuka et al. | |
| 5,770,476 A | | 6/1998 | Stone | |
| 5,798,567 A | | 8/1998 | Kelly et al. | |
| 5,821,627 A | * | 10/1998 | Mori et al. | 257/780 |
| 5,841,194 A | * | 11/1998 | Tsukamoto | 257/702 |
| 5,898,223 A | | 4/1999 | Frye et al. | |
| 5,914,535 A | | 6/1999 | Brandenburg | |
| 6,050,829 A | * | 4/2000 | Eldridge et al. | 439/67 |
| 6,052,287 A | * | 4/2000 | Palmer et al. | 257/774 |
| 6,159,817 A | * | 12/2000 | Altimara et al. | 438/381 |
| 6,180,445 B1 | * | 1/2001 | Tsai | 438/238 |
| 6,169,329 B1 | * | 2/2001 | Farnworth et al. | 257/780 |
| 6,218,729 B1 | * | 4/2001 | Zavrel, Jr. et al. | 257/698 |

* cited by examiner

CIRCUIT STRUCTURE INCLUDING A PASSIVE ELEMENT FORMED WITHIN A GRID ARRAY SUBSTRATE AND METHOD FOR MAKING THE SAME

BACKGROUND OF THE INVENTION

1. Field of the Invention

This invention relates to integrated circuit manufacturing, and more particularly to a circuit structure including a semiconductor-based integrated circuit coupled to a passive element formed within a grid-array packaging substrate, and a method for forming such a structure.

2. Description of the Related Art

The following descriptions and examples are not admitted to be prior art by virtue of their inclusion within this section.

A proliferation in the use of devices employing wireless communication, such as wireless telephones, pagers, and personal digital assistants, has led to increased demands on the integrated circuit (IC) technology used in these devices. Many wireless applications involve the use of mixed mode IC's, or circuits which process both analog and digital signals. For example, digital circuitry may be used for data processing functions in a device such as a wireless telephone, while analog circuitry may be used for transmission and/or reception of data over the wireless link. Differences between properties of analog and digital IC's can make mixed mode circuit design and fabrication challenging. As an example, digital IC's fabricated using silicon metal-oxide-semiconductor (MOS) technology typically operate at low power, and most of the circuit components, including logic gates, memory cells, and loads, may be formed using combinations or modifications of MOS transistors. By contrast, analog circuitry used in a transmitter may need to operate at a relatively high power in order to deliver sufficient signal power to the transmitting antenna. Furthermnore, the tuning and filtering circuitry typically used for wireless transmission and reception generally involves the use of passive circuit elements such as inductors and capacitors.

Formation of inductors in IC technology may be particularly challenging. In order for a tuning circuit or filter to efficiently select a desired frequency, an inductor used in the circuit should have a high "quality factor" Q. The quality factor of an element is proportional to the energy stored in the element divided by the energy dissipated or lost in the element per unit time. One way of achieving a high-Q inductor is therefore to minimize energy loss in the inductor. One mechanism of loss in an inductor is resistive heating, which is proportional to the resistance of the inductor. Another way in which energy may be lost from an inductor is by interaction of the electromagnetic field produced when power is applied to the inductor with a lossy medium proximate to the inductor. A lossy medium as used herein has a sufficient concentration of free charge carriers that interaction with an electromagnetic field can cause ohmic losses in the medium. Semiconductors are therefore generally lossy compared to insulators, and a semiconductor such as silicon is lossy compared to a semiconductor having a larger energy gap, such as gallium arsenide.

The loss mechanisms described above can contribute to difficulties in forming a high-Q inductor within a silicon-based IC. One approach to forming an inductor in an IC is to pattern a trace having a spiral geometry within a deposited conductive layer. The resistance of such an inductor is inversely proportional to the cross-sectional area of the patterned trace, which is in turn proportional to the thickness of the conductive layer. A thick conductive layer would therefore be desirable for forming a low-resistance inductor. Use of a conductor having low resistivity would also help to lower the resistance of the inductor. Low resistance is desirable for reducing the above-described resistive losses within the inductor.

However, the thickness of a conductive layer used in IC fabrication is generally limited because of the narrow interconnect feature sizes used in these circuits. For circuits having interconnect feature sizes of 0.25 micron or less, for example, interconnect metal thicknesses may be limited to approximately one micron or less. Thicker conductor layers for these narrow interconnect features could result in difficulty in filling the spaces between patterned interconnects with a dielectric, because deposition into high-aspect-ratio trenches can result in incomplete filling and/or void formation. This metal thickness limitation may be particularly applicable to the case for which copper is used as the interconnect metal. Copper has the lowest resistivity of the interconnect metals in current use, but copper interconnect formation is typically somewhat more involved than formation of interconnects from other metals such as aluminum. Copper interconnects may be formed by a damascene process, in which trenches are formed in a dielectric layer and metal is then deposited to fill the trenches, with excess metal subsequently removed, generally by chemical-mechanical polishing (CMP). A diffusion barrier/adhesion layer is generally deposited within the trenches, followed by a copper seed layer, and then a copper fill layer. The complexity of the copper interconnect formation process may particularly limit the aspect ratio of the trenches and thereby the thickness of the copper traces.

Because a spiral inductor formed within a silicon-based IC as described above would generally be formed in a layer of the circuit which also included interconnect lines for the circuit, the thickness of the inductor trace would be limited to that of the interconnect lines, though the feature size of the inductor trace may not be as small as that for the interconnect lines. Even in a case for which only the inductor were formed on a particular level of the IC, however, the thickness of the inductor metal would be limited by the amount of elevational disparity which can be accommodated by the planarization processes (typically CMP) used in fabricating the circuit.

In addition to the above-described ohmic losses within the inductor resulting from a nonzero resistance of the inductor metal trace, energy in an inductor formed within a silicon-based IC may also be lost through coupling of the inductor's electromagnetic field with the nearby silicon substrate. An inductor formed within a metallization layer of an IC is generally displaced by no more than a few microns from the semiconductor substrate of the IC. The degree of electromagnetic coupling between the field of the inductor and the semiconductor can therefore be substantial. Interaction of the field of the inductor with silicon, which is relatively lossy compared to materials typically used for substrates in high-frequency circuits, may result in conduction in the silicon and thereby loss of energy from the inductor. The proximity of the silicon substrate may therefore also contribute to difficulty in forming a high-Q inductor in a silicon-based IC.

As an alternative to forming a spiral inductor as described above, inductors have also been formed on IC's using wire-bonding wire. This wire has lower resistance than metallization traces, and coupling to the substrate is reduced because such an inductor extends above the surface of the IC and is therefore largely surrounded by air. Because wire-bonding equipment is not designed to produce coils of wire, however, the resulting inductors are generally short loops having relatively low inductance. Furthermore, the reproducibility of the inductor formation is limited, and hand "tweaking" of the inductor may be needed to adjust its inductance value.

Another approach to formation of circuits having high-Q inductors is hybrid circuit fabrication. Hybrid circuit fabrication typically involves mounting IC's and discrete components onto a low-loss substrate, such as a ceramic substrate, and forming interconnections between these elements. In this way, a high-Q discrete inductor may be combined with a silicon-based IC. However, hybrid circuit fabrication requires additional assembly as compared to IC fabrication, and may be more expensive than IC fabrication when large quantities are produced. Hybrid circuits may also be considerably larger than IC's performing similar functions, which can be disadvantageous for the manufacture of small, lightweight wireless communication devices.

It would therefore be desirable to develop a circuit structure in which a high-Q inductor or other passive circuit element may be combined with a semiconductor-based IC, and a method for forming such a circuit structure. Formation of inductors having a wide range of reproducible inductance values should be achievable by the method, and such inductors should have high quality factor. Furthermore, the circuit structure and its formation should be compatible with IC processing and packaging techniques.

SUMMARY OF THE INVENTION

The problems outlined above are in large part addressed by a circuit structure which includes a passive circuit element formed within a grid-array substrate as may be used for packaging of integrated circuits. The passive element may be formed using one or more conductive layers within the grid-array substrate. Contact pads formed within a semiconductor-based IC may be coupled to terminals of the passive circuit element, thereby forming a circuit including the passive element. The same grid-array substrate in which the passive element is formed is preferably also used for packaging of the IC, so that additional fabrication or assembly beyond that which would typically be employed in packaging the circuit is not required.

A grid-array substrate forms a part of a grid-array IC package having terminals for connection to a circuit board arranged as an array across a surface of the package. For mounting to an upper surface of a circuit board, for example, the terminals are arranged across a lower surface of the package. Forms which the terminals may take include pins, as in a pin-grid-array (PGA) package, or pads to which solder balls or bumps are attached, as in a ball-grid-array (BGA) package. The grid-array substrate forms the base of the grid-array package, and the terminals for connection to the circuit board are typically formed on one surface of the substrate, while pads for connection to the IC are formed on the opposite surface, or IC-mounting surface. The package may further include a cover and/or encapsulation layer for protection of the mounted IC. A grid array substrate is typically formed from materials similar to those used in forming circuit boards, having one or more insulating layers made from materials such as resins, polymers and/or ceramic materials and one or more conductive layers made from materials such as tungsten or copper.

Thicknesses of conductive layers within a grid-array substrate are typically several microns, e.g. 15 microns or more. A metal trace formed by patterning such a conductive layer may therefore have a much lower resistance than a similar trace formed in an interconnect metallization layer of an IC. Passive circuit elements formed using one or more conductive layers of a grid-array substrate, as included in the circuit structures described herein, may therefore have much lower resistance, and correspondingly reduced resistive energy losses, than similar circuit elements formed within a semiconductor-based IC. Such reduced energy losses are believed to allow formation of high-Q passive circuit elements such as inductors and capacitors. The quality factors of such passive circuit elements may further be improved by formation of the circuit elements within the grid-array substrate rather than within the semiconductor-based IC. Although the IC is mounted in close proximity to the grid-array substrate to form the structure described herein, the structure includes an additional distance between the passive element and the semiconductor substrate as compared to the case in which the passive element is formed within the IC. This increased distance may significantly reduce interaction between the electromagnetic field of the passive element and the semiconductor substrate material, thereby reducing energy losses due to conduction in the substrate. The insulating materials (which may include, e.g., ceramics or polyimides) surrounding the passive element within the grid-array substrate are typically much lower-loss than the semiconductor substrate and insulating materials (such as silicon dioxide) used in the IC, further contributing to formation of high-Q passive elements.

The passive circuit elements contemplated herein may be formed by patterning one or more conductive layers within the grid-array substrate, using methods similar to those employed in IC fabrication (though the patterns in the grid-array substrate are generally formed to a larger scale). The circuit elements may therefore be formed predictably and reproducibly to provide precise component values.

In an embodiment of a method described herein, a passive circuit element is formed at least in part within a conductive layer of a grid-array substrate. The conductive layer is preferably formed to have a thickness greater than about 5 microns, and may be formed from copper or other conductive materials. Passive circuit elements which may be formed include inductors, capacitors, and transmission lines. Spiral inductors and some types of transmission line, for example, may be patterned within a single conductive layer, while other elements such as capacitors and transmission lines utilizing a ground plane may be formed using two conductive layers separated by an insulating layer. The passive element formation includes patterning of a conductive layer within the grid-array substrate. This conductive layer may be an outermost layer of the grid-array substrate, such that at least a portion of the passive element is formed on a surface of the grid-array substrate. Alternatively, the conductive layer may be covered with an insulating layer after patterning, such that the passive element is formed in the interior of the grid-array substrate. In embodiments for which one or more of the terminals of the passive element are covered by an insulating layer, conductive vias may be subsequently formed to connect the buried terminals to the IC-mounting surface of the grid-array substrate.

A pair of contact pads within the processed surface of a semiconductor-based integrated circuit may be coupled to the terminals of the passive circuit element, preferably by orienting the integrated circuit such that the processed surface faces the IC-mounting surface of the grid-array substrate. Coupling the pair of contact pads to the passive element terminals may include positioning a solder ball or bump, similar to that which may be used on a BGA package, between each pad and the corresponding terminal. Coupling of the contact pads to the passive element terminals, in combination with coupling of additional IC contact pads to corresponding pads on the grid-array substrate, may also constitute mounting of the IC to the grid-array substrate, or vice versa. The grid-array substrate is preferably of larger area than the IC, so that the grid-array substrate may be used for packaging of the IC as well as for formation of the passive circuit element. In some embodiments, however, a grid-array substrate having a smaller area than that of the IC (or area comparable to that of the IC) and including a passive circuit element may be mounted onto the IC. In such an embodiment, the grid-array substrate would be used to provide the passive circuit element, but not to package the IC. Such an IC/passive element arrangement could be packaged using various structures including an additional, larger grid-array substrate.

In some embodiments of the method, the pair of contact pads within the IC is coupled to the terminals of the passive circuit element such that the processed surface of the IC overlaps the portion of the IC-mounting surface of the grid-array substrate which contains the passive circuit element. For example, if the grid-array substrate is configured such that its IC-mounting surface faces upward, the IC in such an embodiment is mounted so as to cover the passive circuit element. In an alternative embodiment, the pair of contact pads is coupled to the terminals of the passive element such that the IC is laterally displaced (in a direction parallel to the surface of the grid-array substrate) from the passive circuit element. In such an embodiment, coupling the pair of contact pads within the IC to the terminals of the passive element may include connecting the pair of IC contact pads to a corresponding pair of contact pads on the grid-array substrate, wherein the contact pads on the grid-array substrate are connected to the terminals of the passive element by interconnect lines within the grid-array substrate. Lateral displacement of the IC from the passive element may be advantageous by further reducing interaction between an electromagnetic field produced by the passive element and the substrate of the integrated circuit.

In some embodiments for which the IC is laterally displaced from the passive element, a low-loss substrate may also be coupled to the IC-mounting surface of the grid-array substrate, such that the low-loss substrate overlaps the portion of the grid-array substrate containing the passive element. The low-loss substrate may be made from materials including alumina and other ceramic materials. Connecting a low-loss substrate to the grid-array substrate in the vicinity of the passive element may be advantageous in providing a low-loss medium proximate to the passive element so that any energy loss associated with the element's electromagnetic field may be readily predicted. The presence of the low-loss substrate may, for example, reduce interaction of the passive element's electromagnetic field with other parts of the circuit structure, such as a cover of the grid-array package. Furthermore, coupling of a low-loss substrate to the grid-array package may also allow integration of circuit elements, such as transmission lines, formed directly on the low-loss substrate to be coupled to the IC using interconnect lines within the grid-array substrate.

In addition to the method discussed above, a circuit structure is contemplated herein. The circuit structure includes a passive circuit element formed within a grid-array substrate, and a semiconductor-based IC having a pair of contact pads coupled to a pair of terminals of the passive circuit element. The passive circuit element is formed at least in part within a conductive layer within the grid-array substrate, and may in some embodiments be formed using two or more conductive layers and intervening insulating layers. The passive circuit element, such as an inductor, a capacitor, or a transmission line, may be at least in part on the IC-mounting surface of the grid-array substrate. Alternatively, an insulating layer may separate the passive circuit element from the IC-mounting surface. Each conductive layer from which at least a portion of a passive circuit element is formed preferably has a thickness of at least approximately five microns. More preferably, the conductive layer thickness is more than about fourteen microns. The conductive layer may include copper and/or other conductive materials.

The semiconductor-based IC, typically a silicon-based IC, is preferably oriented so that a processed surface of the IC containing the pair of contact pads is facing the IC-mounting surface of the grid-array substrate. In a preferred embodiment, the grid-array substrate has an area greater than that of the IC, and the grid-array substrate is used for packaging of the IC as well as for providing the passive circuit element. In such an embodiment, additional contact pads of the IC may be coupled to corresponding pads on the grid-array substrate, in addition to the coupling of the pair of contact pads to the terminals of the passive element. Alternatively, the grid-array substrate may have an area comparable to or smaller than that of the IC, and not be used to package the IC. In such an embodiment, the coupling between the terminals of the passive element and the pair of contact pads on the IC may constitute a mounting of the grid-array substrate onto the surface of the IC. The IC/passive element combination may be mounted onto an additional, larger grid-array substrate for packaging. In any of the above embodiments of the circuit structure, the connection formed between one of the pair of contact pads and the corresponding terminal of the passive element may contain a solder ball or bump similar to those used in BGA packages.

In an embodiment of the circuit structure, the lateral extent (in a direction parallel to the surface of the grid-array substrate) of the IC overlaps the lateral extent of the passive circuit element. In an alternative embodiment, the IC is laterally displaced from the passive circuit element, and the coupling between one of the pair of contacts and the corresponding terminal of the passive element may include an interconnect line within the grid-array substrate. In such an embodiment for which the IC is laterally displaced from the passive circuit element, a low-loss substrate may be mounted on the grid-array substrate in addition to the IC, such that the lateral extent of the low-loss substrate overlaps that of the passive circuit element. The low-loss substrate may be formed from a ceramic material, such as alumina, and additional circuit elements may be formed on the low-loss substrate.

BRIEF DESCRIPTION OF THE DRAWINGS

Other objects and advantages of the invention will become apparent upon reading the following detailed description and upon reference to the accompanying drawings in which:

FIG. 1b is a top view of the grid-array substrate of FIG. 1a;

FIG. 6b is a top view of the grid-array substrate of FIG. 6a;

FIG. 7b is a top view of the grid-array substrate of FIG. 7a;

FIG. 9b is a top view of the circuit structure of FIG. 9a; and

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 1A:
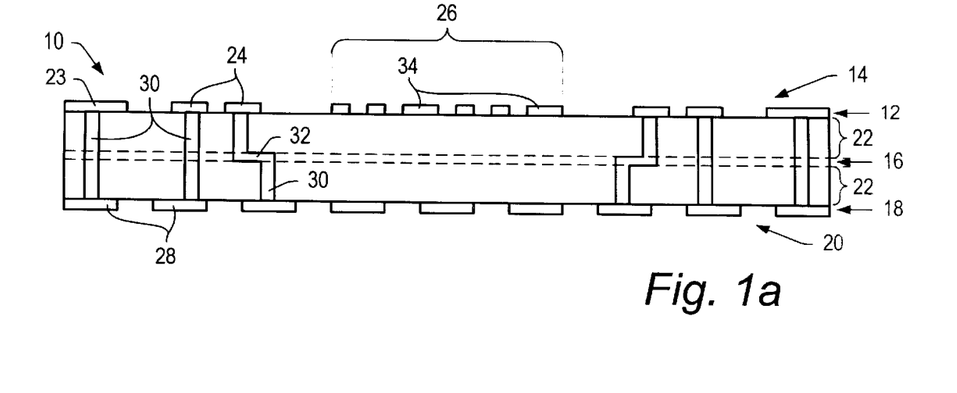
FIG. 1a is a side cross-sectional view of an embodiment of a grid-array substrate including an inductor.
Figure 1B:
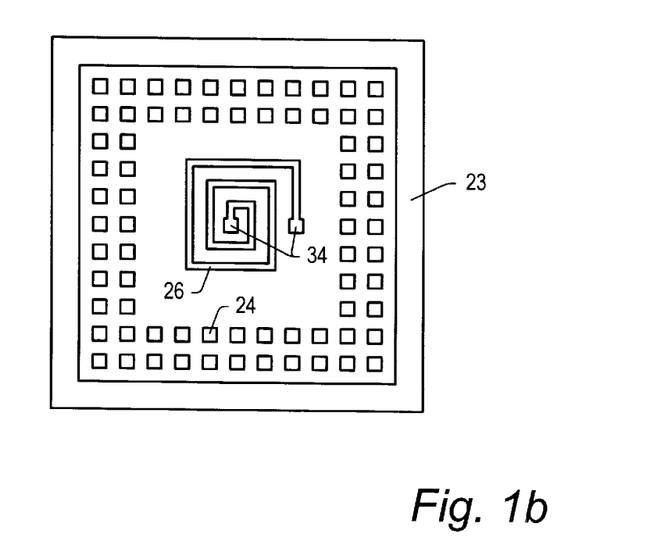

A cross-sectional view of an embodiment of a grid-array substrate is shown in FIG. 1a. Grid-array substrate 10 includes alternating conductive and insulating layers. In the embodiment of FIG. 1a, conductive layer 12 forms part of an IC-mounting surface 14 of substrate 10, conductive layer 16 (denoted by dashed lines) forms an inner conductive layer within substrate 10, and conductive layer 18 forms part of a circuit-board mounting surface 20 of substrate 10. In the embodiment of FIG. 1a, grid-array substrate 10 is oriented such that surface 14 is an upper surface and surface 20 is a lower surface, but other orientations may also be used. Insulating layers 22 are interposed between conductive layers 12 and 16 and between layers 16 and 18. Conductive layers 12, 16 and 18 are patterned to form desired contact, interconnect, and/or passive element structures, such that the conductive layers may not be continuous. For example, in some areas within grid-array substrate 10, insulating layers 22 are adjacent one another, because a portion of conductive layer 16 has been locally removed. Conductive layers 12, 16 and 18 are formed of a conductive material, preferably a metal and more preferably a metal including copper. The conductive layers preferably have a thickness greater than about 5 microns, and more preferably a thickness of about 14 microns or greater. In the embodiment of FIG. 1, conductive layer 12 includes a seal ring structure 23, contact pads 24 for making contact to a mounted IC, and spiral inductor 26, which may be more easily visualized when discussed with respect to FIG. 1b below. Spiral inductor 26 includes inductor terminals 34. Conductive layer 18 includes board contact pads 28 for making contact to a circuit board. Connections between portions of conductive layers 12 and 18 may be made using conductive vias 30 formed within insulating layers 22. Lateral connections between conductive layer portions may include interconnects 32, formed within conductive layer 16.

The geometry of conductive structures which may be formed within conductive layer 12 may be further understood with reference to FIG. 1b, which shows a top view of surface 14 of grid-array substrate 10. Seal ring structure 23 extends around the periphery of substrate 10, and may be used in soldering a cap or cover onto the substrate to complete packaging of a circuit structure. Contact pads 24 are arranged within the seal ring structure. The number and shape of these pads may be varied depending on constraints from, e.g., the layout of the IC to be mounted and the process for fabricating substrate 10. Inductor 26 is formed as a square spiral inductor with terminal pads 34 at each end. Other inductor shapes, such as circular or rectangular spirals or loops, may also be used.

Returning to FIG. 1a, the method by which grid-array substrate 10 is formed may vary depending on the specific materials used. For example, grid-array substrates may be formed using a ceramic such as alumina for insulating layers and refractory metals such as tungsten for conductive layers. Formation of this type of grid-array substrate is typically done using a firing process in which tapes of powdered ceramic held together by an organic binder are printed with metallization patterns of inks containing refractory metal powders. The printed tapes may be laminated together and fired to remove the binders and form the substrate. An alternative type of grid-array substrate is formed using a polymer-based insulator, often a polyimide, with copper conductive layers. The conductive layers may be deposited and/or plated, and then patterned using photolithography and etching techniques similar to those used in semiconductor IC processing. This copper/polymer grid-array substrate technology may be advantageous for the passive device formation described herein, for reasons including the lower resistance of copper as compared to the refractory metals used in the ceramic-based substrates. Conductive vias such as vias 30 of FIG. 1 are typically formed with a drilling process (e.g. laser drilling) and a plating of metal through the holes. Other methods may also be used however, such as formation of conductive bumps extending upward through a polymer insulator, as offered by Yamaichi Electronics USA of San Jose, Calif.

Figure 2:
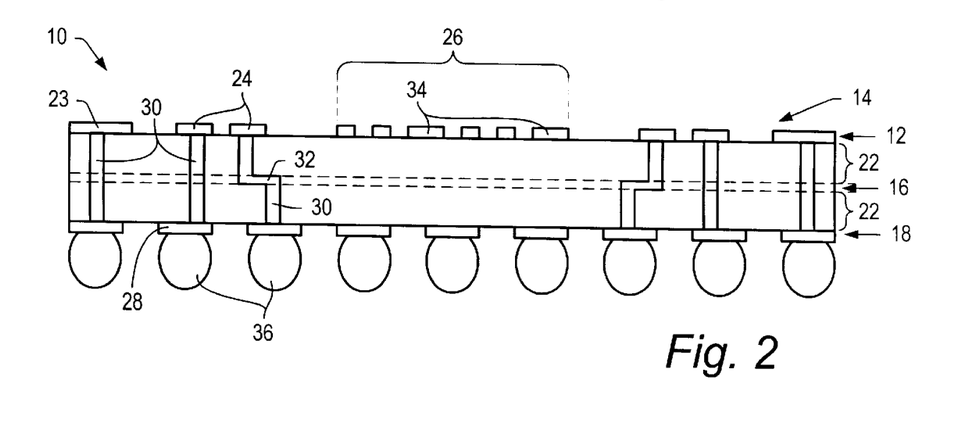
FIG. 2 is a side cross-sectional view of the grid-array substrate of FIG. 1, wherein solder balls are formed for mounting the grid-array substrate to a circuit board.

Turning now to FIG. 2, the grid-array substrate of FIG. 1 is shown with solder balls 36 formed on contact pads 28. Solder balls, or "bumps", 36 may be formed by applying solder to surface 20 of grid-array substrate 10 such that it wets contact pads 28 to form the balls. To subsequently mount grid-array substrate 10 to a circuit board, solder balls 36 may be placed in contact with a set of contact pads on the circuit board. The junction between the circuit board contact pads and balls 36 may be heated to reflow the solder in the balls and form an electrical and mechanical connection. Although grid-array substrate 10 is a BGA substrate, other types of grid-array substrate, such as PGA substrates, could also be used to form the circuit structure described herein.

Figure 3:
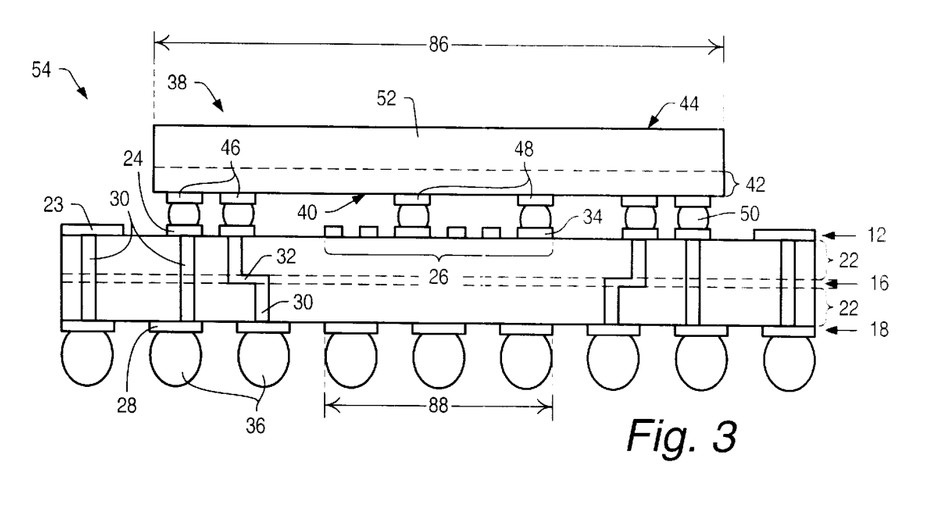
FIG. 3 is a side cross-sectional view of the grid-array substrate of FIG. 2, wherein a pair of contact pads on an integrated circuit are coupled to a pair of inductor terminals such that a circuit structure is formed.

Connection of a semiconductor-based IC to grid-array substrate 10 to form circuit structure 54 is illustrated in FIG. 3. Integrated circuit 38 includes a processed surface 40 adjacent a processed region 42. Processed region 42 includes the transistors, interconnects and other circuit structures formed upon and within substrate 52 of IC 38. Although some processing, such as cleaning, polishing, or metal deposition, may also be performed on backside surface 44 of substrate 52, the integrated circuit is largely formed within region 42, and accessed through contact pads 46 on processed surface 40. Among the contact pads is a pair of passive element contact pads 48, which are coupled to terminals 34 of inductor 26 on grid-array substrate 10. In the embodiment of FIG. 3, IC contact pads 46 and 48 are connected to corresponding grid-array substrate pads 24 and 34 using solder balls 50, in a manner similar to that described above for solder balls 36. Such a connection between pads 48 and terminals 34 is believed to be advantageous by providing a short, low-resistance path between IC 38 and inductor 26. Other configurations may be used for this connection, however. For example, each of terminals 34 of substrate 10 may be connected to one of peripheral contact pads 24, through a combination of vias 30 and interconnect 32. The terminal at the outside of inductor 26 could alternatively be connected to one of pads 24 through an interconnect formed in conductive layer 12. Such connection of terminals 34 to peripheral pads 24 would allow the pair of passive element contact pads 48 to be located at the periphery of IC 38 along with the other contact pads 46, avoiding the need for contact pads formed in the interior of the IC.

The orientation of IC 38 with respect to grid-array substrate 10 such that processed surface 40 faces IC-mounting surface 14 is often called "flip-chip" mounting, since IC 38 may be considered to be upside down. This configuration is also referred to as a "die-down" BGA configuration, since the IC, or die, is facing downward toward the BGA substrate. Alternatively, an IC may be mounted onto a grid-array substrate in a "die-up" configuration. In a die-up configuration, connections between contact pads on the IC and the corresponding pads on the grid-array substrate are generally made by wire bonding. Although die-up mounting may provide some advantages for IC packaging in general, particularly by allowing improved thermal contact between the IC and the grid-array substrate, the associated wire bonding may be less advantageous for the circuit structure described herein, because it may result in a connection having increased resistance and increased parasitic inductance. Continued packaging of circuit structure 54 may include, for example, application of an "underfill" material, typically an epoxy, between IC 38 and grid-array substrate 10 to help mechanically reinforce the connection. A thermally conductive heat spreader may be placed in thermal contact with backside surface 44 of IC 38 to help remove heat from the IC, and a cap or cover may be attached to the package, typically by soldering to seal ring 23.

Figure 4:
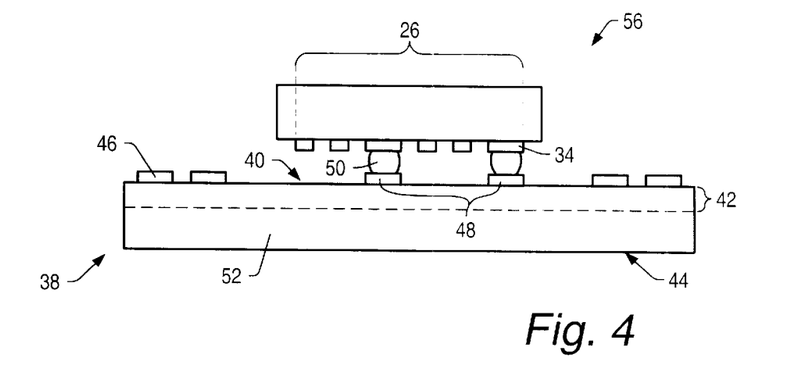
FIG. 4 is a side cross-sectional view of a circuit structure in which a grid-array substrate containing an inductor is mounted on an integrated circuit such that a pair of inductor terminals is coupled to a pair of contact pads on the integrated circuit.

In the circuit structure of FIG. 3, grid-array substrate 10 is used both to provide inductor 26 for connection to IC 38 and for packaging of IC 38. In an alternative embodiment of a circuit structure illustrated in FIG. 4, inductor 26 is formed within a grid-array substrate 56 which is not used for packaging of IC 38. Instead, grid-array substrate 56 is mounted onto IC 38 such that terminals 34 of the inductor are coupled to passive element contact pads 48. Circuit structure 56 may be subsequently packaged using, e.g., a larger grid-array substrate to which IC 38 is mounted in a die-up position. In some embodiments, multiple grid-array substrates similar to substrate 56 may be mounted onto an IC such as IC 38 in a similar manner.

Figure 5A:
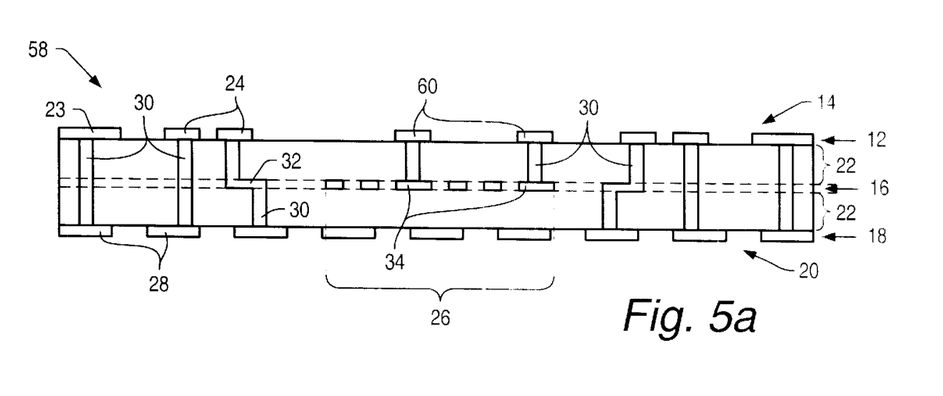
FIG. 5a is a side cross-sectional view of an alternative embodiment of a grid-array substrate, in which an inductor is formed in a conductive layer below the surface of the grid-array substrate.
Figure 5B:
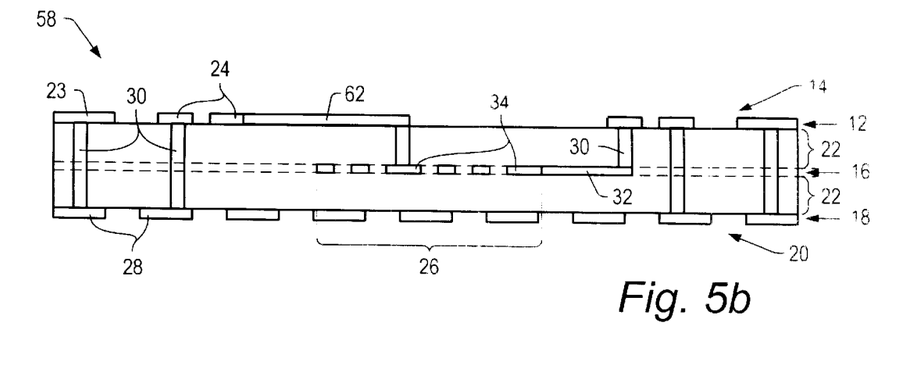
FIG. 5b is a side cross-sectional view of another embodiment of the grid-array substrate of FIG. 5a, wherein each of the inductor terminals is connected to a contact pad near the periphery of the IC-mounting surface of the grid-array substrate.

Although the embodiments of FIGS. 1–4 illustrate an inductor formed within the conductive layer forming part of the IC-mounting surface of the grid-array substrate, a passive element may additionally or alternatively be formed using a conductive layer within the interior of the grid-array substrate, as shown in FIG. 5. Grid-array substrate 58 of FIG. 5a is similar to grid-array substrate 10 of FIGS. 1–3, but with inductor 26 formed within internal conductive layer 16 rather than conductive layer 12. In the embodiment of FIG. 5a, conductive vias 30 connect terminals 34 to overlying contact pads 60, which may be coupled to, for example, passive element contact pads 48 of IC 38 shown in FIG. 3. Terminals 34 may be connected to the IC-mounting surface of grid-array substrate 58 in other ways, however, such as that shown in FIG. 5b. Conductive vias 30, along with buried interconnect 32 and surface interconnect 62, may be used to connect each of terminals 34 to one of peripheral contact pads 24. Numerous other interconnect configurations using conductive layers either at the surface of or within grid-array substrate 58 could also be used.

Figure 6A:
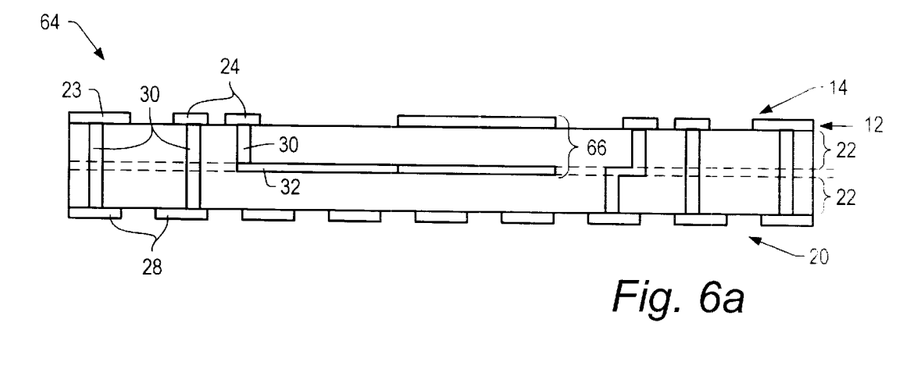
FIG. 6a is a side cross-sectional view of an embodiment of a grid-array substrate containing a capacitor.
Figure 6B:
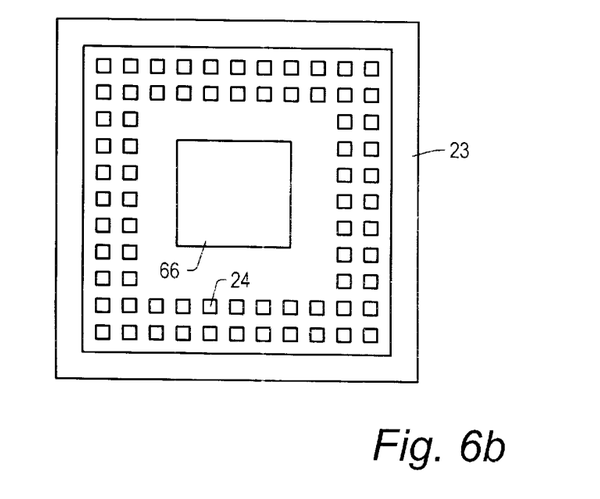
Figure 7A:
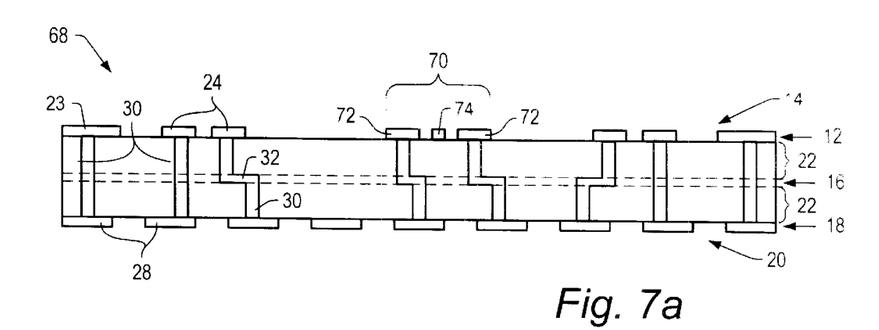
FIG. 7a is a side cross-sectional view of an embodiment of a grid-array substrate containing a coplanar waveguide transmission line.
Figure 7B:
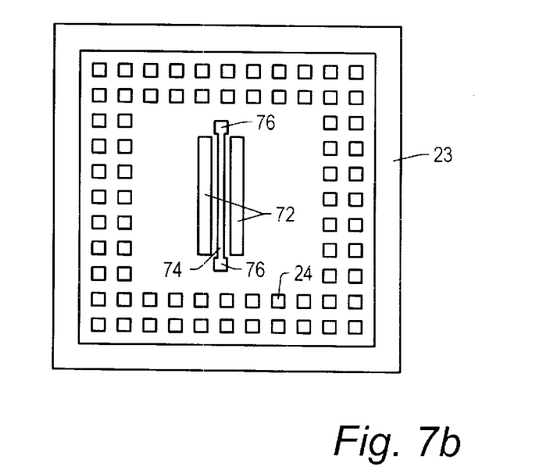
Figure 8:
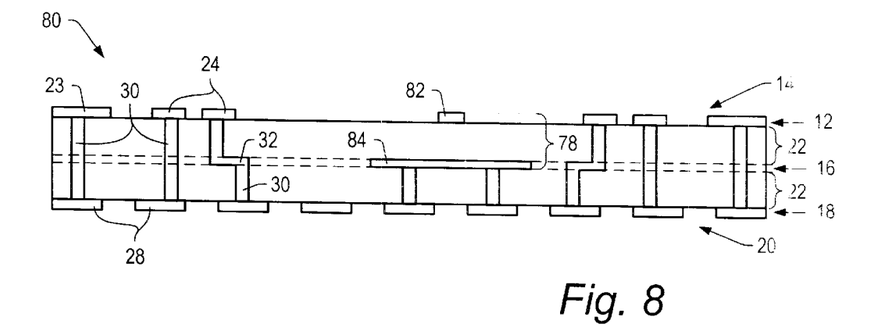
FIG. 8 is a side cross-sectional view of an embodiment of a grid-array substrate containing a microstrip transmission line.

Examples of passive circuit elements other than inductors which may be formed within a grid-array substrate are shown in FIGS. 6–8. FIG. 6a is a side cross-sectional view of a grid-array substrate containing a capacitor. Grid-array substrate 64 is similar to grid-array substrates 10 and 58 described above, but has a capacitor 66 formed using conductive layers 12 and 16 and the interposed insulating layer. Each plate of the capacitor is one of its terminals. In the embodiment of FIG. 6a, one terminal is formed at the surface of the grid-array substrate from conductive layer 12, and is therefore easily accessible for coupling to a passive element contact pad on an IC. The other terminal is connected using an interconnect 32 and conductive via 30 to one of peripheral contact pads 24. A top view of grid-array substrate 64 is shown in FIG. 6b. Although capacitor 66 is shown as having a square geometry, any desired shape may be used. Formation of a capacitor within a grid-array substrate allows a very large capacitor area to be used without sacrificing space on the integrated circuit.

An example of a transmission line formed within a single conductive layer of a grid-array substrate is shown in FIG. 7. Grid-array substrate 68 of FIG. 7a includes coplanar waveguide (CPW) structure 70 formed from conductive layer 12. Signal line 74 of CPW structure 70 has shielding lines 72 on either side. Lines 72 are preferably connected together, and typically connected to ground potential, as may be done through connection to one or more of pads 28 as shown in FIG. 7a. The top view of substrate 68 illustrated in FIG. 7b shows the layout of CPW structure 70, including terminals 76 of signal line 74. Passive element contact pads such as pads 48 on an IC such as IC 38 of FIG. 3 may be coupled to terminals 76. In alternative embodiments, several other transmission line types may be formed from a single conductive layer, including coplanar stripline and slot line. Such transmission lines may be formed within an interior conductive layer such as layer 16, rather than in conductive layer 12, in a manner similar to that shown for inductor 26 of FIG. 5. Turning now to FIG. 8, an example is shown of a transmission line formed using two conductive layers. Grid-array substrate 80 includes microstrip transmission line 78, formed within conductive layers 12 and 16. Signal line 82 is displaced by an insulating layer 22 from ground plane 84, which may be connected to ground potential through contact pads 28. Although not shown in FIG. 8, each end of signal line 82 includes a terminal pad for coupling to one of a pair of passive element contact pads on an IC. Any of the passive elements shown in FIGS. 6–8, as well as other passive elements not shown, may be coupled to a pair of passive element contact pads on an IC to form a circuit structure such as structure 54 of FIG. 3. Furthermore, terminals of these passive elements may be connected to peripheral contact pads 24 using innumerable interconnection schemes.

Figure 9A:
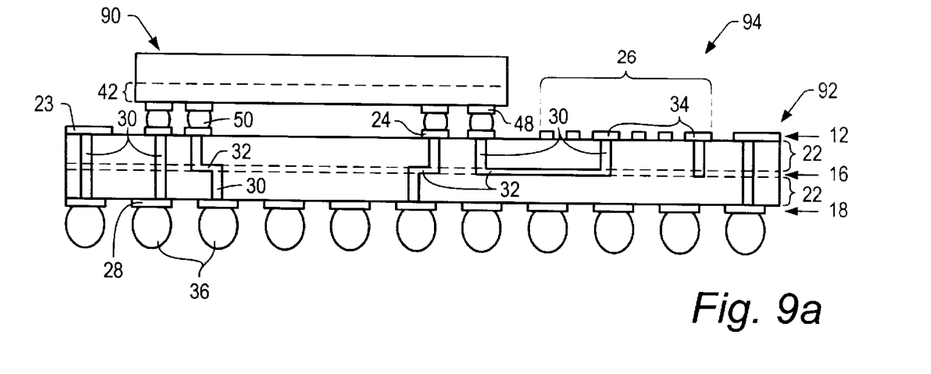
FIG. 9a is a side cross-sectional view of an embodiment of a circuit structure in which an inductor is laterally displaced from an integrated circuit.
Figure 9B:
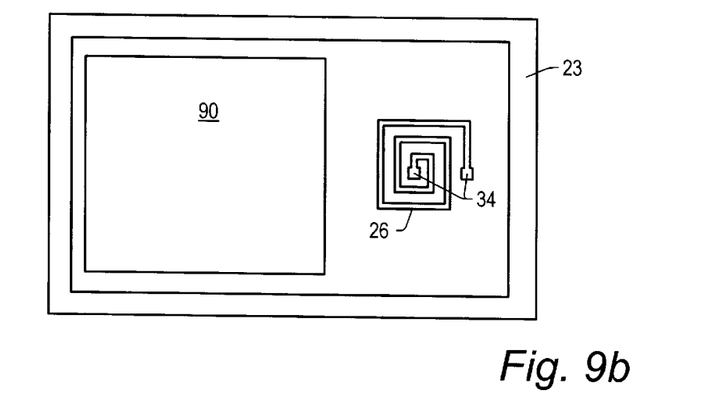

In the case of circuit structure 54 shown in FIG. 3 above, a lateral extent 86 (in a direction parallel to the surface of grid-array substrate 10) of IC 38 overlaps a lateral extent 88 of inductor 26. In other words, IC 38 is mounted directly above inductor 26 (or directly below, in an embodiment such as that of FIG. 4). An alternative embodiment, in which an IC is laterally displaced from a passive element formed within a grid-array substrate, is shown in FIG. 9. Grid-array substrate 92, though similar to grid-array substrate 10, has inductor 26 formed outside the area defined by IC contact pads 24, to which IC 90 is connected to form circuit structure 94. Each of terminals 34 of inductor 26 is connected to one of IC contact pads 24 through conductive vias 30 and interconnects 32 within grid-array substrate 92 (some of these connections are not visible in the view of FIG. 9a). In this way, passive element contact pads 48 of IC 90 (one of which is visible in FIG. 9a) may be coupled to terminals 34 of inductor 26. Although the coupling between IC 90 and inductor 26 is less direct than that shown in FIG. 3 between IC 38 and inductor 26, the configuration of circuit structure 94 may be advantageous in removing the semiconductor substrate (typically a silicon substrate) associated with IC 48 from the immediate proximity of inductor 26. In this way, interaction between the semiconductor substrate and the electromagnetic field of inductor 26 may be further reduced, thereby increasing the achievable quality factor of the inductor. A top view of circuit structure 94 is shown in FIG. 9b. Packaging of circuit structure 94 may be continued in a manner similar to that described above for circuit structure 54 of FIG. 3.

Figure 10:
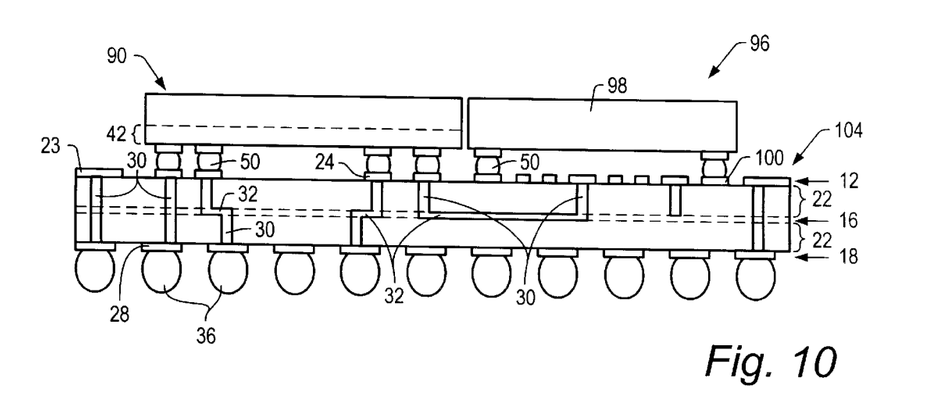
FIG. 10 is a side cross-sectional view of an embodiment of a circuit structure in which a low-loss substrate is mounted in proximity to an inductor laterally displaced from an integrated circuit.

Circuit structure 96 of FIG. 10 is similar to circuit structure 94 of FIG. 9, but also includes a low-loss substrate 98 mounted onto grid-array substrate 104 over inductor 26. Grid-array substrate 104 is similar to substrate 92 of FIG. 9. Low-loss substrate 98 is preferably a material having a low conductivity compared to that of the substrate of IC 90, and may be a ceramic material such as alumina. In the embodiment of FIG. 10, low-loss substrate 98 is mounted using solder balls 50 between contact pads 100 on grid-array substrate 104 and contact pads 102 on low-loss substrate 98. Contact pads 100 are similar to contact pads 24, and are used for connecting to low-loss substrate 98. In an embodiment of circuit structure 96, contact pads 102 on low-loss substrate 98 may connect to a passive element, such as a transmission line, formed on low-loss substrate 98. This passive element may then be connected to inductor 26 and/or IC 90 using interconnects within grid-array substrate 104. In other embodiments, contact pads 102 may not be connected to a circuit element and used instead for forming a mechanical connection using solder balls 50. Mounting of low-loss substrate 98 may also be achieved in other ways such as using an adhesive or film between low-loss substrate 98 and grid-array substrate 104. In addition to allowing integration of circuit elements which may be formed on low-loss substrate 98, the configuration of circuit structure 96 of FIG. 10 may also provide a well-characterized low-loss medium in the proximity of inductor 26, so that any losses related to electromagnetic field interactions may be accurately predicted. The presence of low-loss substrate 98 may also reduce interaction of an electromagnetic field from inductor 26 with other items which may be in the vicinity, such as a conductive heat spreader or package cover. Packaging of circuit structure 96 may be continued in a manner similar to that described for circuit structures 92 and 54.

It will be appreciated to those skilled in the art having the benefit of this disclosure that this invention is believed to provide a circuit structure combining an integrated circuit with one or more passive elements formed within a grid-array substrate, and a method for forming such a structure. Further modifications and alternative embodiments of various aspects of the invention will be apparent to those skilled in the art in view of this description. For example, any of the passive elements described herein may be used to form any of the exemplary circuit structures described herein. A grid-array substrate as used in the circuit structure and method described herein may include multiple alternating conductive and insulating layers, beyond those of the grid-array substrates illustrated in the drawings. Furthermore, multiple passive circuit elements may be included within a grid-array substrate, and multiple IC's may be mounted to a grid-array substrate in some embodiments. It is intended that the following claims be interpreted to embrace all such modifications and changes and, accordingly, the specification and drawings are to be regarded in an illustrative rather than a restrictive sense.

What is claimed is:

1. A circuit structure, comprising:
    a grid-array substrate comprising a first conductive layer;
    a passive circuit element formed at least in part within the first conductive layer, wherein the passive circuit element comprises a pair of terminals; and
    a semiconductor-based integrated circuit having a processed surface facing a surface of the grid-array substrate, wherein a pair of passive element contact pads within the processed surface is coupled to the pair of terminals, respectively, and wherein the passive circuit element is laterally displaced from the semiconductor-based integrated circuit.

2. The circuit structure as recited in claim 1, wherein the first conductive layer comprises copper.

3. The circuit structure as recited in claim 1, wherein the first conductive layer has a thickness greater than approximately five microns.

4. The circuit structure as recited in claim 1, wherein the first conductive layer forms a portion of the surface of the grid-array substrate.

5. The circuit structure as recited in claim 1, wherein the grid-array substrate further comprises an insulating layer between the first conductive layer and the surface of the grid-array substrate.

6. The circuit structure as recited in claim 1, wherein a connection between one of the pair of passive element contact pads and one of the pair of terminals comprises a solder ball.

7. The circuit structure as recited in claim 1, wherein the passive circuit element comprises an inductor.

8. The circuit structure as recited in claim 1, wherein the passive circuit element comprises a transmission line.

9. The circuit structure as recited in claim 1, wherein the grid-array substrate further comprises a second conductive layer and an insulating layer interposed between the first and second conductive layers, and wherein the passive circuit element is formed at least in part within a combination of the first and second conductive layers and the insulating layer.

10. The circuit structure as recited in claim 9, wherein the passive circuit element comprises a capacitor.

11. The circuit structure as recited in claim 1, further comprising a low-loss substrate coupled to the surface of the grid-array substrate, wherein the low-loss substrate is laterally displaced from the semiconductor-based integrated circuit, and wherein a lateral extent of the low-loss substrate overlaps a lateral extent of the passive circuit element.

12. The circuit structure as recited in claim 11, wherein the low-loss substrate comprises alumina.

13. The circuit structure as recited in claim 1, wherein said semiconductor-based integrated circuit comprises a silicon-based integrated circuit.

14. A method for forming a circuit structure, comprising:
   forming at least a portion of a passive circuit element within a conductive layer of a grid-array substrate;
   coupling a pair of terminals within the passive circuit element to a pair of passive element contact pads within a processed surface of a semiconductor-based integrated circuit, such that the processed surface faces a surface of the grid-array substrate; and
   coupling a low-loss substrate to the surface of the grid-array substrate.

15. The method as recited in claim 14, wherein said forming at least a portion comprises patterning the conductive layer.

16. The method as recited in claim 15, wherein said forming at least aportion further comprises:
   forming a dielectric layer over the patterned conductive layer; and
   forming a pair of conductive vias between the pair of terminals, respectively, and the surface of the grid-array substrate.

17. The method as recited in claim 14, wherein said coupling a pair of terminals comprises positioning a pair of solder balls between the pair of terminals and the pair of passive element contact pads, respectively.

18. A method for forming a circuit structure, comprising coupling a pair of passive element contact pads within a semiconductor-based integrated circuit to a pair of terminals within a passive circuit element formed within a grid-array substrate, wherein a surface of the integrated circuit containing the passive element contact pads is oriented to face a surface of the grid-array substrate, and wherein said coupling a pair of passive element contact pads comprises laterally displacing the semiconductor-based integrated circuit from the passive circuit element to reduce interaction between the integrated circuit and an electromagnetic field generated by the passive circuit element.

19. The method as recited in claim 14, wherein said coupling the low-loss substrate comprises laterally displacing the low-loss substrate from the semiconductor-based integrated circuit.

20. The method of as recited 14, wherein said coupling the low-loss substrate comprises overlapping a lateral extent of the low-loss substrate over a lateral extent of the passive circuit element.

\* \* \* \* \*

UNITED STATES PATENT AND TRADEMARK OFFICE
CERTIFICATE OF CORRECTION

PATENT NO.    : 6,362,525 B1
DATED         : March 26, 2002
INVENTOR(S)   : Rahim It is certified that error appears in the above-identified patent and that said Letters Patent is hereby corrected as shown below:

<u>Column 14,</u>
Line 2, after the phrase "forming at least" please delete the word "aportion" and substitute therefor -- a portion --.

Signed and Sealed this

Sixteenth Day of July, 2002

*Attest:*

*Attesting Officer*

JAMES E. ROGAN
*Director of the United States Patent and Trademark Office*